United States Patent [19]

Hong

[11] Patent Number: 5,378,647

[45] Date of Patent: Jan. 3, 1995

[54] METHOD OF MAKING A BOTTOM GATE MASK ROM DEVICE

[75] Inventor: Gary Hong, Hsin-Chu,

[73] Assignee: United Microelectronics Corporation, Hsinchu, Taiwan, Prov. of China

[21] Appl. No.: 140,404

[22] Filed: Oct. 25, 1993

[51] Int. Cl.$^6$ .......................................... H01L 27/112
[52] U.S. Cl. ....................................... 437/48; 437/50; 437/52
[58] Field of Search .................... 437/48, 50, 52; 257/390

[56] References Cited

U.S. PATENT DOCUMENTS 3,914,855 10/1975 Cheney et al. .................... 437/48
5,002,896 3/1991 Naruke ............................ 437/48

Primary Examiner—Tom Thomas
Attorney, Agent, or Firm—George O. Saile; Graham S. Jones

[57] ABSTRACT

The process comprises a sequence of steps initiated by forming a word line mask on the surface of a substrate of a first conductivity type. Ions are implanted to form word lines covered by a dielectric layer. A polysilicon layer doped with a given conductivity type on the dielectric layer is formed on a second dielectric layer on the polysilicon layer. Bit lines are formed with a different conductivity type in the polysilicon layer. Forming a code mask above the polysilicon layer with openings above predetermined regions, etched through the mask to remove predetermined regions in the first polysilicon layer, whereby the ROM is encoded. Preferably, a combined silicon dioxide and silicon nitride layer is formed above the polysilicon layer before forming the code mask. Preferably, the silicon dioxide is deposited first, patterned and used as a mask for forming dopant patterns in the polysilicon layer through openings therein. Preferably, a layer of silicon nitride is deposited upon the silicon dioxide to a greater thickness than the silicon dioxide and is then planarized. Preferably, the dielectric layer formed above the word lines comprises a gate oxide layer.

10 Claims, 5 Drawing Sheets

METHOD OF MAKING A BOTTOM GATE MASK ROM DEVICE

BACKGROUND OF THE INVENTION

1. Field of the Invention

This invention relates to Read Only Memory (ROM) manufacturing techniques and devices produced thereby and more particularly to code implanting during ROM manufacturing.

2. Description of Related Art

ROM devices are standard components of modern computer systems. A ROM comprises an array of Metal Oxide Semiconductor Field Effect Transistor (MOSFET's) arranged in columns and rows, wherein predetermined MOSFET's are either permanently conductive or nonconductive as a function of the variety of transistor. The alternative on/off operation of these devices states of the MOSFETs is adapted to use for storage of data, which remains in the device when the external power supply is off.

A ROM device includes an array of parallel, closely spaced lines regions formed of a heavily doped impurity in a semiconductor substrate having an opposite type of background impurity. On the surface of the substrate an insulating layer is formed thereon. Another array of closely spaced conductive lines formed on the surface of the insulating layer is arranged at right angles to the spaced lines in the substrate. Insulating layers are formed on %he upper array of conductive lines. A metallurgy layer connects the two arrays of lines to circuits to address the lines and to read the data stored in the RAM, as is well known in the art.

At the intersection of a conductive line in the upper array which is commonly referred to in most cases as a "word line" and a pair of adjacent lines in the substrate, known in most cases as the "bit lines", a MOSFET is formed. The spaced lines in the substrate comprise the source and drain of the MOSFET. The conductive word line serves as the gate electrode of the MOSFET. Certain predetermined MOSFET's can be made permanently conductive by forming a region of an impurity of the same type as that in the bit lines, between adjacent bit lines and beneath the corresponding conductive line. These permanently conductive regions are known as code implants, and they are placed in the substrate to provide specific binary data.

The conventional manufacturing process is to form the code implant regions very early in the ROM fabrication process, since an annealing step is required to activate the implanted impurity and also to recrystallize any implanted areas of the substrate. The annealing process involves heating the substrate above an acceptable temperature, which would damage the completed device, since the aluminum metallization conventionally used is damaged above a temperature of about 400° C. to about 450° C. for more than a minimum time interval, and the maximum possible temperature is the melting point of aluminum which is about 660° C.

An object of this invention is to form a ROM in which the damage caused by annealing to activate an implanted impurity is not employed subsequent to programming the code in the ROM.

A significant advantage of the process of this invention is that no implantation process is employed for programming following a metal etching step, so no thermal anneal is required.

Another advantage of the present invention is that the mask ROM process is suitable for VLSI applications and employs post metallization programming with no high temperature process requirement after programming.

The programming method of this invention employs an etching process to remove the channel area to encode the ROM, thus the transistor (memory cell) is open or non-conductive in the area removed.

For the structure of the instant invention, the gate electrode can also be made with polysilicon 1 and the source/drain and channel of the transistor can be formed at poiysilicon 2 if a double polysilicon process is used.

SUMMARY OF THE INVENTION

In accordance with this invention a semiconductor device is manufactured by the process comprises the steps of (a) forming a word line mask on the surface of a work piece comprising a semiconductor substrate of a first conductivity type, (b) performing an ion implantation into the surface of the substrate through the mask to form word lines in the substrate of an opposite conductivity type, (c) forming a dielectric layer on the substrate above the word lines, (d) forming a polysilicon layer doped with a given conductivity type on the dielectric layer, (e) forming a second dielectric layer on the polysilicon layer, (f) forming bit lines with a different conductivity type in the polysilicon layer, and (g) forming a code mask above the polysilicon layer with openings above predetermined regions, (h) and etching through the mask to remove predetermined regions in the first polysilicon layer, whereby the ROM is encoded.

Preferably, a combined silicon dioxide and silicon nitride layer is formed above the polysilicon layer before forming the code mask.

Preferably, the silicon dioxide is deposited first, patterned and used as a mask for forming dopant patterns in the polysilicon layer through openings therein.

Preferably, a layer of silicon nitride is deposited upon the silicon dioxide to a greater thickness than the silicon dioxide and is then planarized.

Preferably, the dielectric layer formed above the word lines comprises a gate oxide layer.

In another aspect of this invention, a ROM semiconductor device is manufactured by the process comprising the steps of (a) forming in the surface of a semiconductor substrate of a first conductivity type, word lines of a second conductivity type, (b) forming a first dielectric layer on the substrate above the word lines, (c) forming a first polysilicon layer on the first dielectric layer, (d) performing a first uniform ion implantation into the first polysilicon layer with a given conductivity type, (e) forming a dielectric layer on the first polysilicon layer, (f) forming a bit line mask on the first dielectric layer and (g) etching to form openings through the first dielectric layer to the first polysilicon layer, (h) performing a second ion implantation through the openings into the first polysilicon layer to form bit lines in the first polysilicon layer with a different conductivity type from the uniform ion implantation, (i) removing the mask, (j) forming an insulating layer on the dielectric layer and into the openings therein into contact with the first polysilicon layer, (k) planarizing the insulating layer to expose the surface of the dielectric layer leaving an alternating insulating and dielectric layer, (l) forming a glass layer on the insulating layer and dielectric layer, (m) forming a code mask on the glass layer with openings above predetermined dielectric regions, (n) and etching through the mask to remove predetermined regions in the first polysilicon layer, whereby the ROM is encoded.

Preferably, the glass comprises BPSG.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 1:
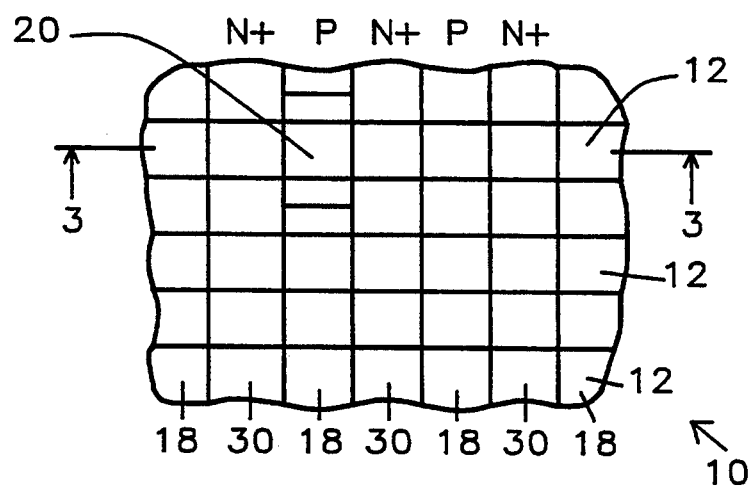
FIG. 1 is a plan view of a ROM device formed on a P-substrate in accordance with this invention.

In FIG. 1, a plan view of a ROM device 10 formed on a semiconductor P− substrate 11 which has been implanted with buried N+ word lines 12 which are an array of parallel, closely spaced lines defining N+ doped word line regions 12 formed of a heavily doped opposite type of background impurity impurity to the P− substrate 11. Above the word lines 12 on the surface of the substrate is formed an insulating layer comprising a gate oxide 22. A second array of closely spaced conductive N+ bit lines 30 is formed on the surface of the insulating layer. The array of bit lines 30 is arranged at right angles to the spaced word lines 12.

Figure 2:
FIG. 2 is a fragmentary, sectional view, a P-semiconductor substrate in the preliminary stages of processing to form a ROM of the kind shown in FIG. 1.
Figure 2:
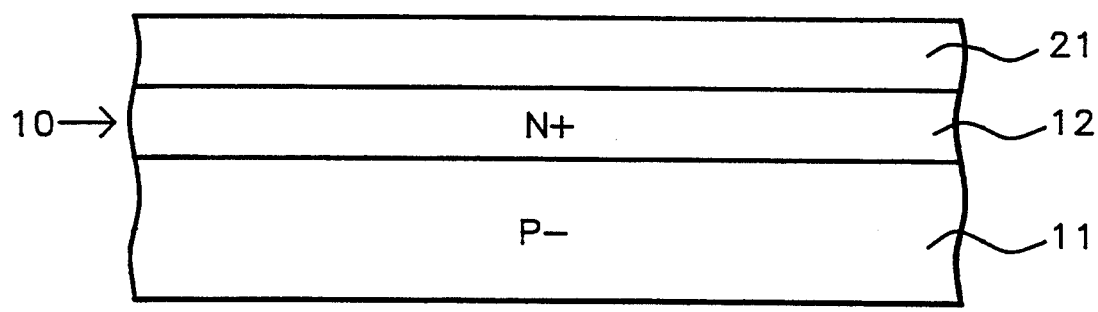

FIG. 2 is a fragmentary, sectional view, a P-semiconductor substrate 11 with a layer of photoresist 21 patterned by a mask and developed to open a word line pattern for ion implanting word lines 12 with one shown in section. The word lines 12 are formed by the conventional process of ion implantation of ions 23. An ion implant of buried arsenic (As) N+ ions 23 is deposited into the word line regions 12 using the mask layer 21. The chemical species of the dopant is arsenic which is implanted with a dose from about $1 \times 10^{15}/cm^2$ to about $5 \times 10^{16}/cm^2$. It is implanted at an energy of between about 30 keV and about 100 keV in a high current implanter type of tool.

Then the photoresist 21 is removed using a conventional well known process.

A gate oxide layer 22 having a thickness of about 200Å is formed over the substrate 11 including the word lines 12 formed therein. Next, a polysilicon layer 24 is deposited upon the gate oxide layer 22. Polysilicon layer 24 is formed to a thickness of about 500Å to about 3,000Å using a conventional method such as LPCVD.

Figure 3:
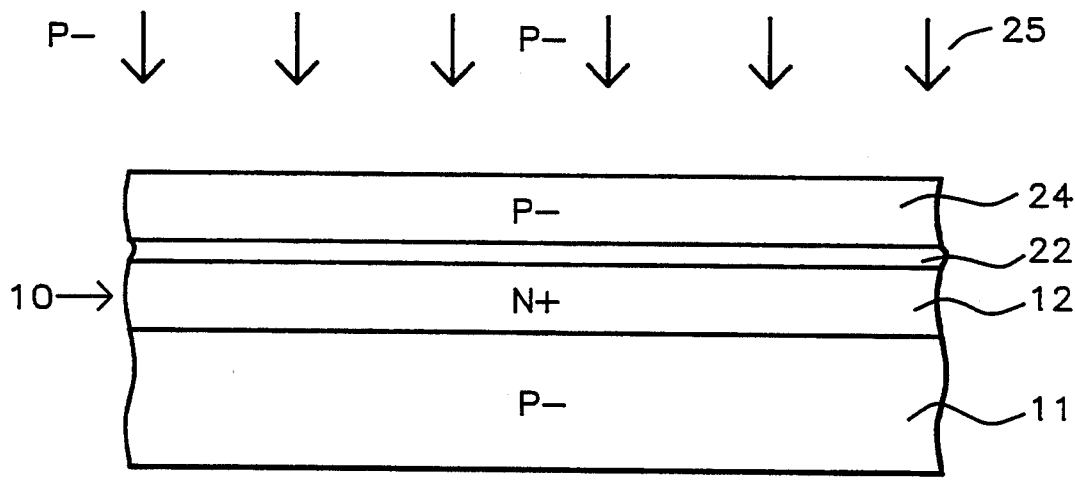
FIG. 3 shows the device of FIG. 2 with the entire polysilicon layer being doped P− by ion implantation.

Then referring to FIG. 3, which is a cross section taken along line 3—3 in FIG. 1, the entire polysilicon layer 24 is doped P− by ion implantation by ions 25. The preferred chemical species of the dopant 25 implanted is boron with a dose of between about $8 \times 10^{11}/cm^2$ to about $8 \times 10^{12}/cm^2$, at an energy of about 50 keV.

Figure 4:
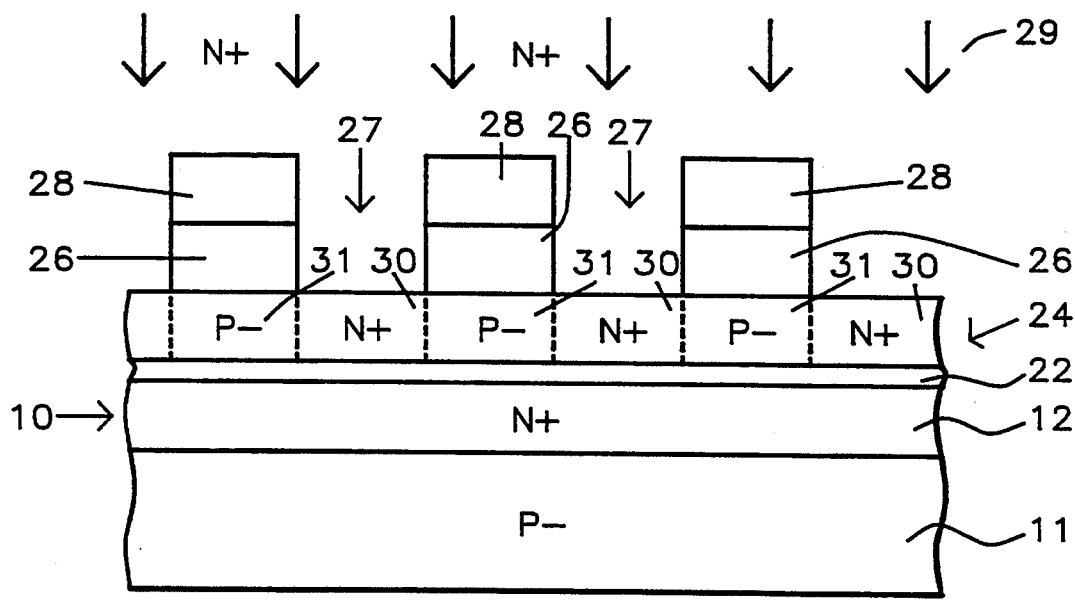
In FIG. 4, the device of FIG. 3 is shown after silicon dioxide is deposited by a CVD process.

Referring to FIG. 4 a thin layer of about 1000Å of silicon dioxide 26 (SiO2) is deposited by a CVD process at a range of temperatures from about 300° C. to about 400° C.

Next a photoresist layer 28 is deposited upon the silicon dioxide layer 26 and the bit line mask is employed to expose the photoresist layer 28 which is developed forming openings 27 which are used to etch corresponding openings therebelow in the new silicon dioxide layer 26, which now becomes strips of silicon dioxide exposing portions of the surface of polysilicon layer 24.

Now, N+ ion implant of buried arsenic (As) N+ ions 29 are deposited into the bit line regions 30 in polysilicon layer 24 using the photoresist layer 28 and the silicon dioxide layer 26 as a mask. The regions 30 are separated by P− regions 31 in layer 24, which were not doped by ions 29. The chemical species of the dopant is arsenic which is implanted with a dose of between about $1 \times 10^{15}/cm^2$ to about $8 \times 10^{15}/cm^2$, preferably less than or equal to $8 \times 10^{15}/cm^2$. It is implanted at an energy of between about 30 keV and about 80 keV in a high current implanter type of tool.

Next the remaining photoresist is stripped from the device of FIG. 4.

Figure 5:
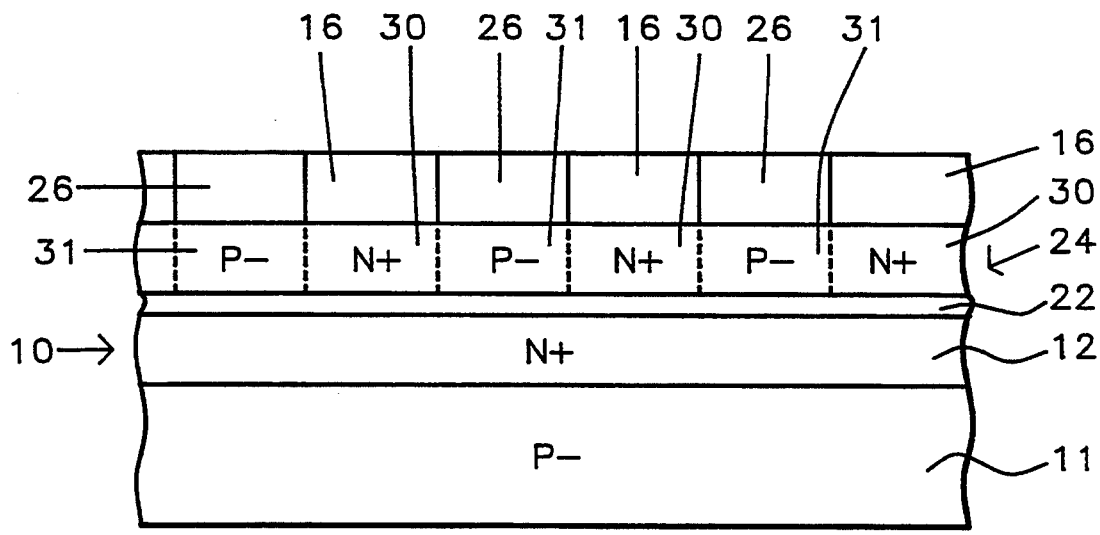
In FIG. 5, the device of FIG. 4 is shown after silicon nitride has been deposited followed by planarization.

In FIG. 5, the device is shown after a layer 16 of silicon nitride about 2000Å has been deposited by a conventional silicon nitride Si3N4 deposition process, followed by a nitride planarization process to bring the nitride thickness down to about 1000Å.

Figure 6:
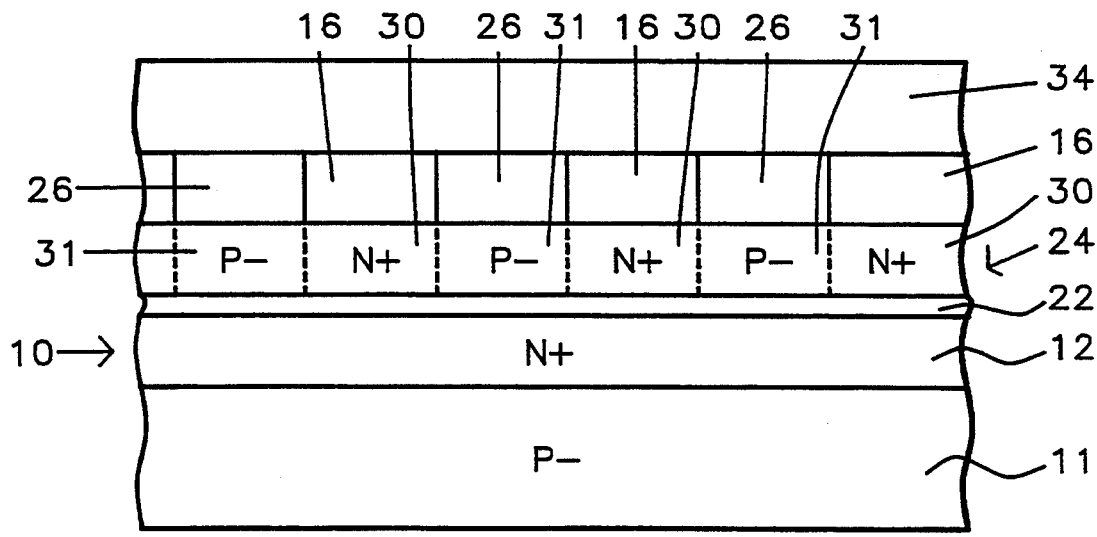
In FIG. 6, a glass layer has been formed on the device of FIG. 5.

In FIG. 6, a glass layer 34, preferably BPSG has been formed with a thickness of about 5,000Å with boron (B) about 4.0% and phosphorous (P) about 4.0%.

The device is next heated to reflow the BPSG layer 34 at a temperature of about 900° C.

Masking for contacts followed by etching follows; followed by metallization, masking and etching; followed by formation of the alloy by annealing at about 400° C. in a furnace. These steps are performed in accordance with well known processes.

Figure 7:
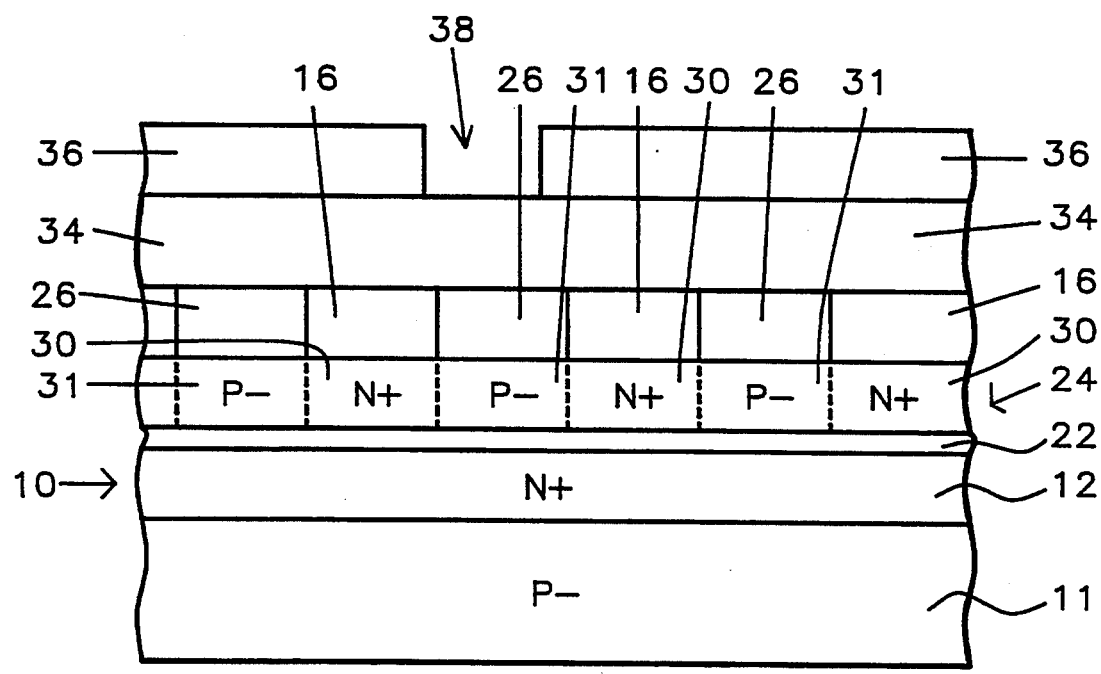
FIG. 7 shows the device of FIG. 6 after a photoresist layer has been deposited, exposed through a ROM code mask and developed to form an opening down to the glass layer.

FIG. 7 shows the device of FIG. 6 after an additional photoresist layer 36 has been deposited exposed through a ROM code mask and developed to form opening 38 in resist layer 36 down to the BPSG glass layer 34.

Figure 8:
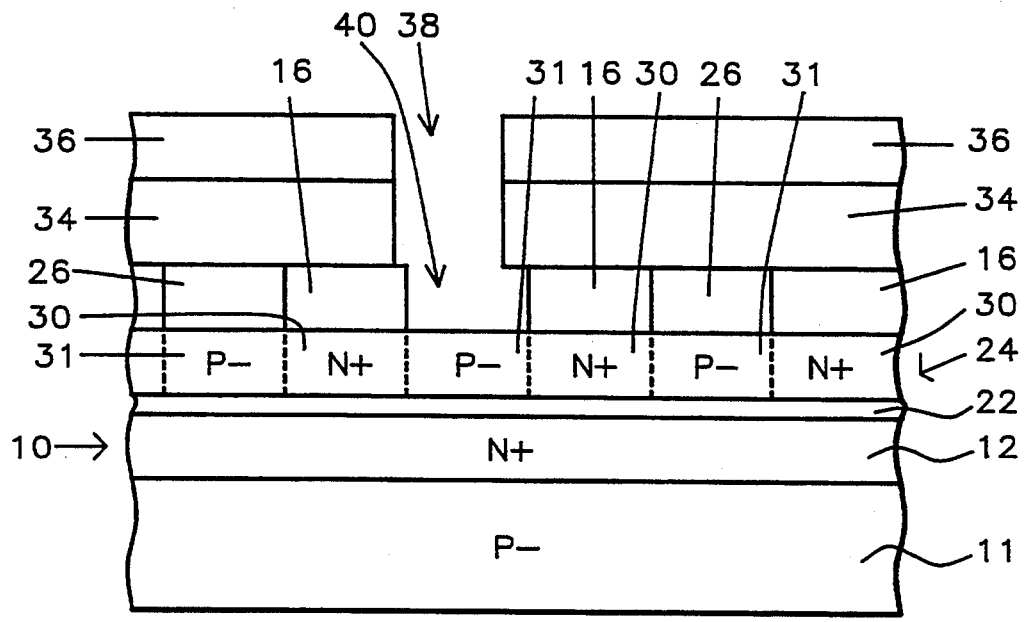
In FIG. 8, the opening has been extended through the glass and SiO2 layers by etching.

In FIG. 8, the opening 38 has been extended through BPSG layer 34 and SiO2 layer 26 forming space 40 by etching with a plasma oxide etch using resist layer 36 as a mask exposing a predetermined part of one of the P− regions 31 in polysilicon layer 24. Note that the opening 38 is misaligned with P− region 31, which it is intended to expose.

Figure 9:
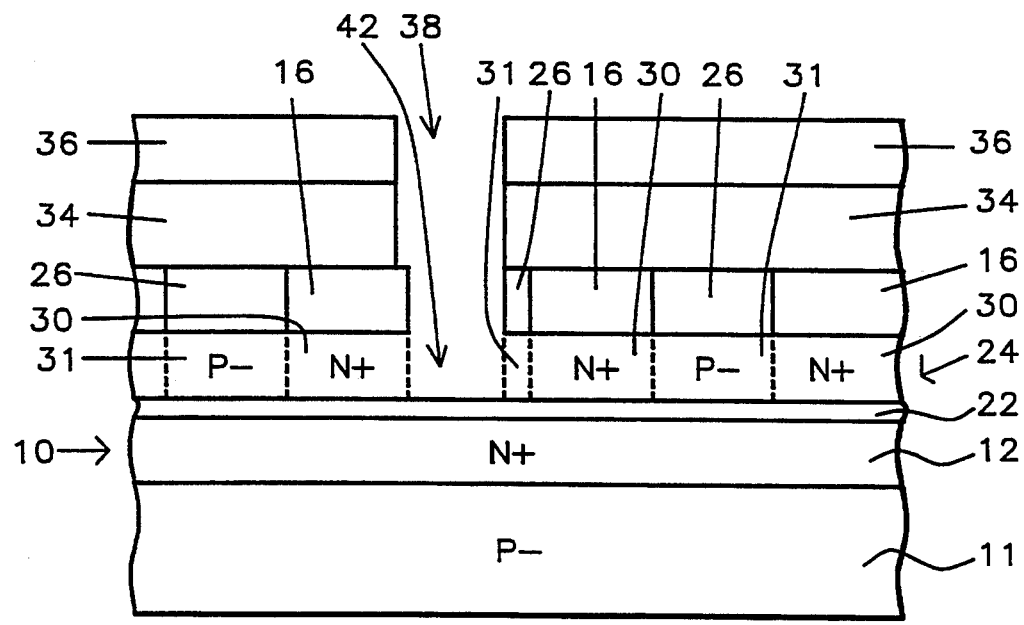
In FIG. 9, in the coding step, the opening has been extended through the P− doped polysilicon making an opening in polysilicon channel area layer down to the gate oxide layer thereby removing the channel area. The polysilicon is etched by means of plasma polysilicon etching.

In FIG. 9, in the coding step, the opening 38 has been extended further through the P− doped polysilicon 31 forming space 42 in polysilicon channel area layer 24 extending down to the gate oxide layer 22 thereby removing the channel area. The polysilicon is etched by means of plasma poiysilicon etching.

Next a standard passivation layer is applied to the product of FIG. 9 employing a well known process has been as will be well understood by those skilled in the art.

Subsequently a passivation masking, and etching step is performed. Part of the polysilicon (channel) is not removed because of misalignment. However, removal of only part of the channel which is exposed is sufficient to turn the transistor to the open state.

SUMMARY

A significant advantage of the process of this invention is that no implantation process was employed for programming following a metal etching step, so no thermal anneal is required after programming. Another advantage of the present invention is that the mask ROM process is suitable for VLSI applications and employs post metallization programming with no high temperature process requirement after programming. The programming method of this invention employs an etching process to remove the channel area to encode the ROM, thus the transistor (memory cell) is open or non-conductive in the area removed. For the structure of the instant invention, the gate electrode can also be made with polysilicon 1 and the source/drain and channel of the transistor can be formed at polysilicon 2 if a double polysilicon process is used.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A method of manufacturing a ROM semiconductor device, which comprises the steps of
    (a) forming a word line mask with a word line pattern therein on the surface of a work piece comprising a P− semiconductor substrate of a first conductivity type,
    (b) performing an ion implantation into the surface of said substrate through said word line pattern in said mask to form doped word lines in said substrate of N+ ions,
    (c) forming a first dielectric layer on said substrate above said word lines,
    (d) forming a polysilicon layer doped with a P conductivity type on said dielectric layer,
    (e) forming a second dielectric layer on said polysilicon layer,
    (f) forming an ion implant mask over said dielectric layer patterned by a bit line mask and then ion implanting N ions through said ion implant mask to form bit lines with an N conductivity type in said polysilicon layer,
    (g) forming a code mask above said polysilicon layer with openings therethrough, and
    (h) etching through said mask to remove code regions in said polysilicon layer,
    whereby said ROM is encoded.

2. The method of claim 1 wherein a combined silicon dioxide and silicon nitride layer is formed above said polysilicon layer before forming said code mask.

3. The method of claim 2 wherein said silicon dioxide is deposited first, patterned and used as a mask for forming dopant patterns in said polysilicon layer through openings therein.

4. The method of claim 3 wherein a layer of silicon nitride is deposited upon said silicon dioxide to a greater thickness than said silicon dioxide and is then planarized.

5. The method of claim 1 wherein said first dielectric layer formed above said word lines comprises a gate oxide layer.

6. The method of claim 5 wherein a combined silicon dioxide and silicon nitride layer is formed above said polysilicon layer before forming said code mask.

7. The method of claim 6 wherein said silicon dioxide is deposited first, patterned and used as a mask for forming dopant patterns in said polysilicon layer through openings therein.

8. The method of claim 7 wherein a layer of silicon nitride is deposited upon said silicon dioxide to a greater thickness than said silicon dioxide and is then planarized.

9. A method of manufacturing a ROM semiconductor device, which comprises the steps of
    (a) forming in the surface of a semiconductor substrate of a P conductivity type, word lines of an N conductivity type,
    (c) forming a first dielectric layer on said substrate above said word lines,
    (d) forming a polysilicon layer on said first dielectric layer,
    (e) performing a first uniform ion implantation into said polysilicon layer with a P conductivity type,
    (f) forming a second dielectric layer on said polysilicon layer,
    (g) forming a bit line mask on said first dielectric layer,
    (h) etching to form openings through said second dielectric layer to said polysilicon layer,
    (i) performing a second ion implantation through said openings into said polysilicon layer to form bit lines in said polysilicon layer with an N conductivity type,
    (i) removing said bit line mask,
    (j) forming an insulating layer on said second dielectric layer and into said openings therein into contact with said polysilicon layer,
    (k) planarizing said insulating layer to expose the surface of said second dielectric layer leaving an alternating of said insulating layer and said second dielectric layer, (l) forming a glass layer on said insulating layer and said second dielectric layer, (m) forming a code mask on said glass layer with openings above said second dielectric layer, and (n) etching through said mask to remove code regions in said polysilicon layer, whereby said ROM is encoded.

10. The method of claim 9 wherein said glass comprises BPSG.

* * * * *